United States Patent
Bu et al.

(10) Patent No.: US 10,090,032 B2
(45) Date of Patent: Oct. 2, 2018

(54) WORD LINE DRIVING UNIT WITH A BOOST VOLTAGE GENERATOR AND MEMORY DEVICE INCLUDING THE SAME

(71) Applicant: Taiwan Semiconductor Manufacturing Company Limited, Hsinchu (TW)

(72) Inventors: Ming-En Bu, Shanghai (CN); Ching-Wei Wu, Nantou County (TW); He-Zhou Wan, Shanghai (CN); Weiyang Jiang, Jiangshan (CN)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/426,709

(22) Filed: Feb. 7, 2017

(65) Prior Publication Data

US 2017/0345473 A1    Nov. 30, 2017

Related U.S. Application Data

(60) Provisional application No. 62/341,689, filed on May 26, 2016.

(51) Int. Cl.
*G11C 11/00* (2006.01)
*G11C 8/08* (2006.01)

(52) U.S. Cl.
CPC ..................................... *G11C 8/08* (2013.01)

(58) Field of Classification Search
CPC ......... G11C 5/145; G11C 8/08; G11C 11/406; G11C 11/4085
See application file for complete search history.

(56) References Cited

U.S. PATENT DOCUMENTS

| | | | | |
|---|---|---|---|---|
| 6,044,017 A * | 3/2000 | Lee | ..................... | G11C 16/0483 365/185.11 |
| 6,275,425 B1 * | 8/2001 | Eliason | .................. | G11O 5/145 327/530 |
| 8,842,479 B2 * | 9/2014 | Huang | ............... | G11C 16/0483 365/185.02 |
| 9,196,338 B2 * | 11/2015 | Kawasumi | .......... | G11C 11/1673 |

* cited by examiner

*Primary Examiner* — Hien Nguyen
(74) *Attorney, Agent, or Firm* — Jones Day (57) ABSTRACT

A method includes delaying an input voltage signal to generate an output voltage, enabling a capacitor unit to apply across a word line driver a boosted voltage greater than the output voltage, and enabling the word line driver to provide a driving voltage that corresponds to the boosted voltage. A word line driving unit that performs the method and a memory device that includes the word line driving unit are also disclosed.

20 Claims, 6 Drawing Sheets

WORD LINE DRIVING UNIT WITH A BOOST VOLTAGE GENERATOR AND MEMORY DEVICE INCLUDING THE SAME

CROSS-REFERENCE TO A RELATED APPLICATION

This application claims priority to U.S. Provisional Patent Application No. 62/341,689, filed May 26, 2016, which is incorporated herein by reference in its entirety.

BACKGROUND

A memory device may operate at a low source voltage, e.g., about 0.44V. During read operations of the memory device, a word line driver provides a driving voltage that drives a word line, whereby a bit '0' or '1' of data is stored in a memory cell. However, at such a low operating voltage, a pulse duration of the driving voltage has to be lengthened, e.g., about 28 ns, which is undesirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various exemplary embodiments of a memory device that includes a word line driving unit. The word line driving unit provides a driving voltage that has a relatively short pulse duration without increasing an operating voltage of the memory device, in a manner that will be described in detail herein. The present disclosure also provides a method of performing read and write operations on memory cells of the memory device using the word line driving unit.

Figure 1:
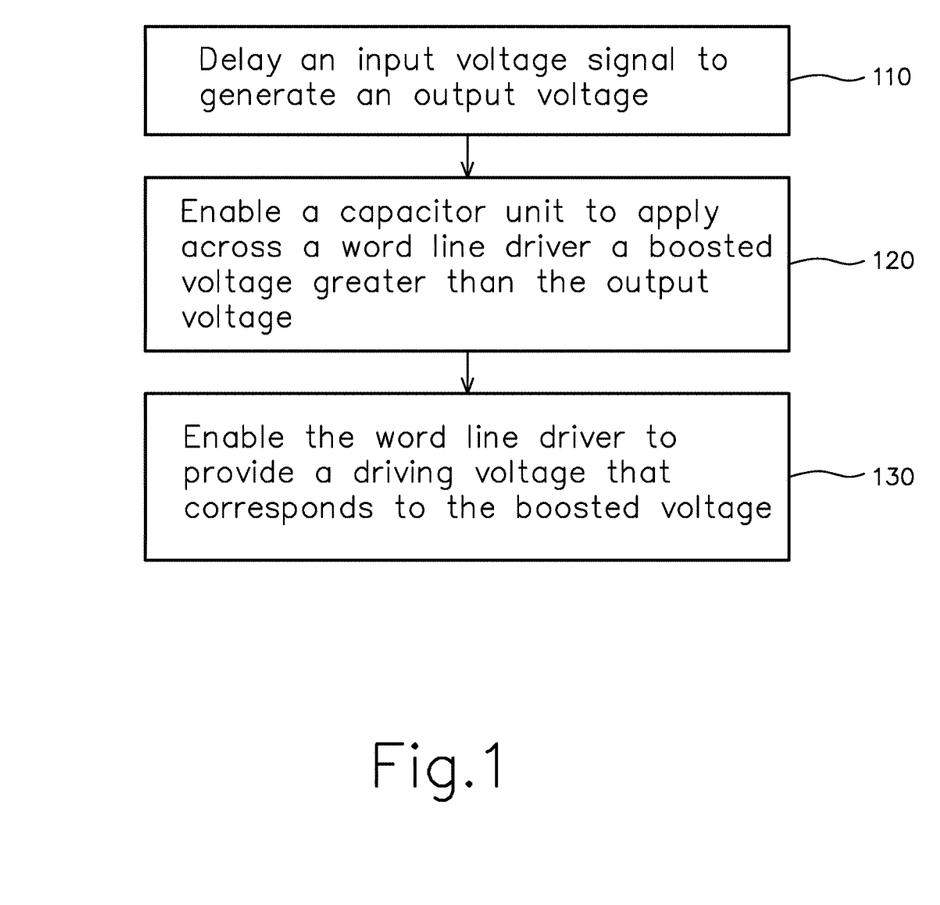
FIG. 1 is a flow chart of an exemplary method for performing a read operation on a memory device according to some embodiments.

A method for performing a read operation on a memory cell of a memory device, according to some embodiments, is illustrated in FIG. 1. In operation 110, an input voltage signal is delayed to generate an output voltage. In some embodiments, the output voltage corresponds to an operating voltage of the memory device, i.e., a source voltage, e.g., 0.44 V, applied across the memory device. In operation 120, a capacitor unit is enabled to apply across a word line driver a boosted voltage greater than the output voltage. In operation 130, the word line driver is enabled to provide to a word line connected to a memory cell of a memory device a driving voltage that corresponds to the boosted voltage. This results in a relatively short pulse duration, e.g., 12.63 ns in an embodiment, for the driving voltage. Concurrently, a bit line selector selects a bit line connected to the memory cell, whereby a bit of data is read from the memory cell. In some embodiments, operations 110, 120, and 130 are performed during write operations of the memory device. In this embodiment, the memory device 200 is a read-only memory (ROM) device. In another embodiment, the memory device 200 is a random access memory (RAM) device.

Figure 2:
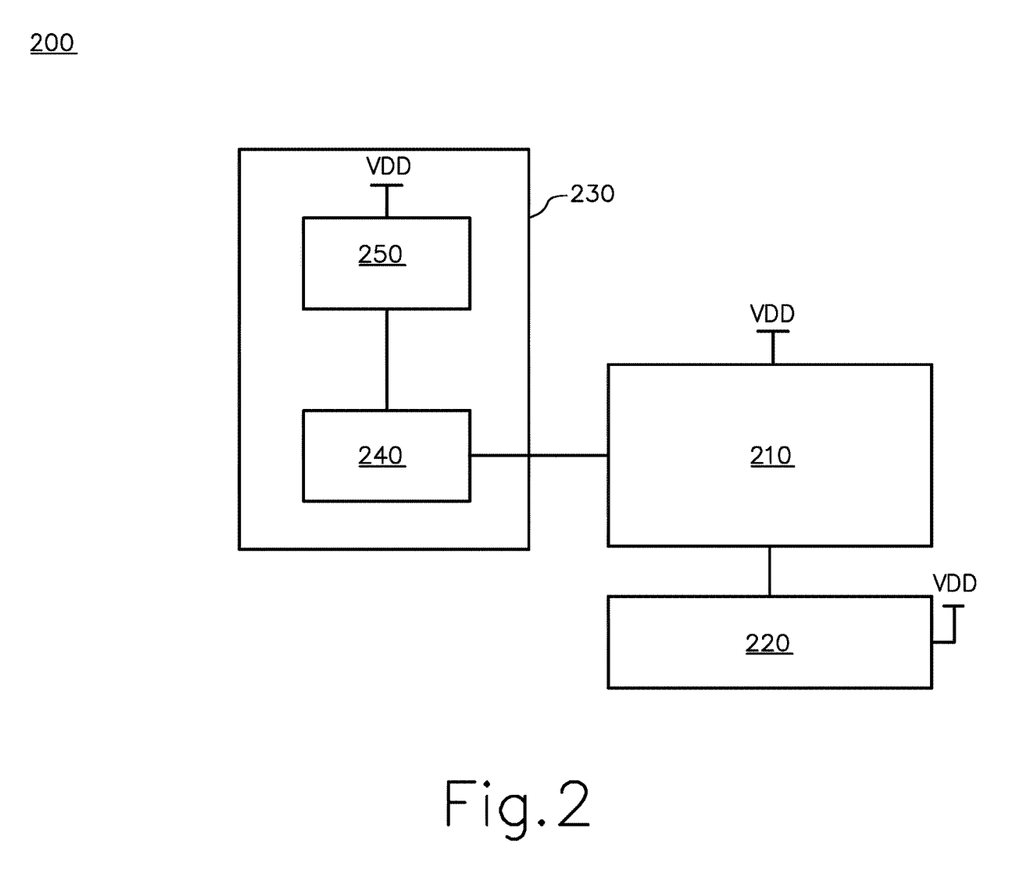
FIG. 2 is a schematic diagram of an exemplary memory device according to some embodiments.

An exemplary memory device, according to some embodiments, is illustrated in FIG. 2. As illustrated in FIG. 2, the memory device 200 is powered by or operated at a source voltage (VDD), e.g., 0.44 V, and includes a cell unit 210, a bit line selecting unit 220, and a word line driving unit 230. In this embodiment, the memory device 200 is a ROM device. In another embodiment, the memory device 200 is a RAM device.

Figure 3:
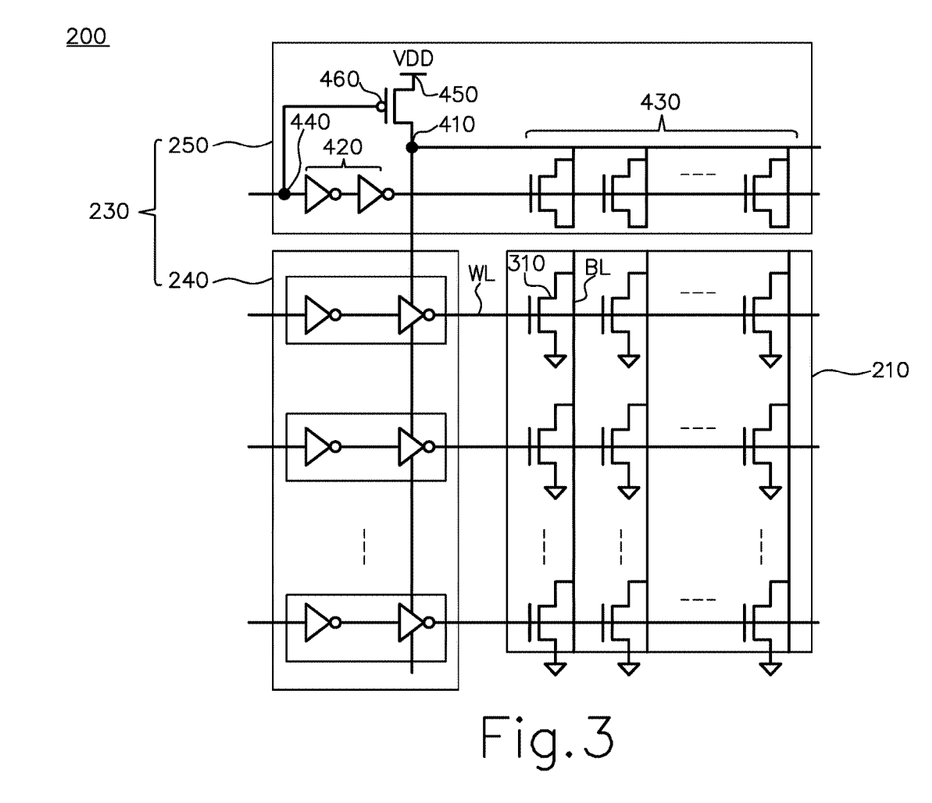
FIG. 3 is a schematic diagram of an exemplary word line driving unit of a memory device according to some embodiments.

An exemplary cell unit of the memory device 200, according to some embodiments, is illustrated in FIG. 3. The cell unit 210 includes a plurality of memory cells arranged in an array of rows and columns. For clarity, only one of the memory cells of the cell unit 210 is labeled as 310 in FIG. 3. In this embodiment, each of the memory cells of the cell unit 210 includes an n-channel metal-oxide-semiconductor field-effect transistor (NMOSFET) that has a first source/drain terminal, a second source/drain terminal, and a gate terminal. The memory device 200 further includes a plurality of word lines, each of which is connected to the gate terminals of the NMOSFETs of the memory cells of the cell unit 210 in a respective one of the rows. The memory device 200 further includes a plurality of bit lines. For clarity, only one of the word lines/bit lines is labeled as WL/BL in FIG. 3. In an alternative embodiment, each of the memory cells of the cell unit 210 includes a p-channel MOSFET (PMOSFET). It will be appreciated that each of the memory cells of the cell unit 210 may include other than a MOSFET.

In this embodiment, the first source/drain terminal of the NMOSFET of the memory cell in each of the columns is connected to a respective one of the bit lines. The second source/drain terminals of the NMOSFETs of the memory cells in the columns are connected to a reference voltage node, to which a reference voltage, e.g., a ground voltage, is applied. In some embodiments, at least one of the first source/drain terminals of the NMOSFETs of the memory cells in the columns is floating. In other embodiments, at least one of the second source/drain terminals of the NMOSFETs of the memory cells in the columns is floating.

With further reference to FIG. 2, the bit line selecting unit 220 includes a plurality of bit line selectors (not shown), each of which is connected to a respective one of the bit lines, and is configured to select one of the bit lines. In an alternative embodiment, the memory device 200 may further include a plurality of source lines (not shown), each of which is connected to the second source/drain terminals of the NMOSFETs of the memory cells of the cell unit 210 in a respective one of the rows. In such an alternative embodiment, the memory device 220 may further include a source line driving unit (not shown) that includes a plurality of source line drivers, each of which is connected to a respective one of the source lines, and that is configured to drive one of the source lines.

The word line driving unit 230 includes a driver circuit 240 and a boost voltage generator 250. As illustrated in FIG. 3, the driver circuit 240 includes a plurality of word line drivers, each of which is connected to a respective one of the word lines. The word line driving unit 230 is configured to drive one of the word lines, in a manner that will be described hereinafter.

Figure 4:
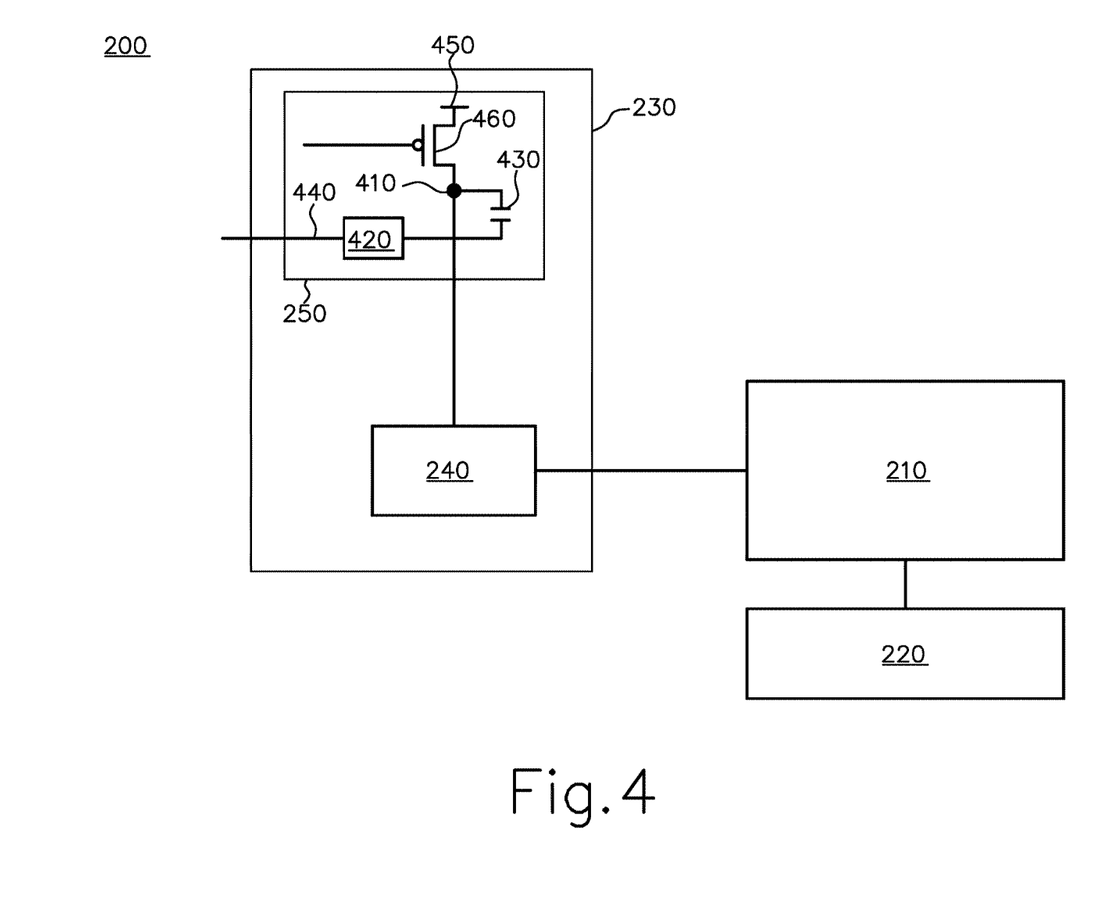
FIG. 4 is a schematic diagram of an exemplary boost voltage generator of a word line driving unit of a memory device according to some embodiments.

An exemplary boost voltage generator of the word line driving unit 230 of the memory device 200, according to some embodiments, is illustrated in FIG. 4. The boost voltage generator 250 includes a boost voltage node 410, a delay circuit 420, and a capacitor unit 430. With further reference to FIG. 3, the boost voltage node 410 is connected to the word line drivers of the driver circuit 240. The word line drivers of the driver circuit 240 therefore share a common boost voltage generator 250. The capacitor unit 430 includes a plurality of n-channel MOS (NMOS) capacitors, each of which has first and second source/drain terminals connected to each other and to the boost voltage node 410. In some embodiments, the capacitor unit 430 includes a plurality of p-channel MOS (PMOS) capacitors. In other embodiments, the capacitor unit 430 may include any type of capacitor, including, for example, a metal-insulator-metal (MIM) capacitor. As will be described further below, the boost voltage generator 250 is configured to generate a boosted voltage at the boost voltage node 410 greater than the source voltage (VDD).

As illustrated in FIG. 3, the NMOS capacitors of the capacitor unit 430 in this embodiment are arranged along a row direction. In a certain embodiment, the number of the NMOS capacitors corresponds to the number of the memory cells in a row. The construction as such permits a substantially constant boosted voltage that may be applied across the word line drivers of the driver circuit 240 regardless of the size of the cell unit 210. In such a certain embodiment, as illustrated in FIG. 3, the number of the NMOS capacitors is equal to the number of the memory cells in a row. It will be appreciated that the NMOS capacitors of the capacitor unit 430 may be arranged in other orientations, e.g., along a column direction, as needed and the number thereof corresponds, e.g., equal, to the number of the memory cells in a column.

Each of the NMOS capacitors of the capacitor unit 430 further includes a gate terminal. The boost voltage generator 250 further includes a boost enable node 440. The delay circuit 420 has an input terminal connected to the boost enable node 440 and an output terminal connected to the gate terminals of the NMOS capacitors of the capacitor unit 430. In this embodiment, the delay circuit 420 includes a pair of inverters that are connected in series. The delay circuit 420 may include any number of inverters. Other configurations for the delay circuit 420 may be used so long as they achieve the intended purpose.

The boost voltage generator 250 further includes a source voltage node 450 and a switch 460. The switch 460 in this embodiment is a PMOSFET and has a first source/drain terminal connected to the boost voltage node 410, a second source/drain terminal connected to the source voltage node 450, and a gate terminal connected to the boost enable node 440. In some embodiments, the switch 460 is an NMOSFET. In other embodiments, the switch 460 may be any type of transistor, including, for example, a bipolar junction transistor (BJT).

The read and write operations of the memory device 200 will now be described, by way of example, with reference to FIG. 3.

When performing a read operation on a selected one of the memory cells of the cell unit 210, e.g., the memory cell 310, an input voltage signal at the boost enable node 440 transitions from low to high. The high input voltage signal, which corresponds to the source voltage (VDD), is applied to the gate terminal of the switch 460. This electrically decouples the boost voltage node 410 from the source voltage node 450.

The high input voltage signal is also applied to the input terminal of the delay circuit 420, which delays, i.e., inverts twice a level of, the high input voltage signal to generate a high output voltage at the output terminal of the delay circuit 420. This enables the capacitor unit 430 to apply a boosted voltage greater than the high output voltage to the boost voltage node 410, i.e., across the word line driver of the driver circuit 240 connected to the memory cell 310 through the word line (WL). This, in turn, enables the word line driver of the driver circuit 240 to provide to the word line (WL) a driving voltage that corresponds to the boosted voltage. Concurrently, the bit line selecting unit 220 (see FIG. 2) selects the bit line (BL), whereby a bit '0' or '1' is read/retrieved from the memory cell 310.

Subsequently, read operations, which are similar to the read operation described above, are performed on the other memory cells of the cell unit 210, whereby data are read from the memory device 200.

It should be understood that the delay circuit 420 may be configured to ensure that the boost voltage node 410 is electrically decoupled from the source voltage node 450 by the time the high output voltage reaches the gate terminals of the NMOS capacitors of the capacitor unit 430 during read operations of the memory device 200.

Thereafter, when performing a write operation on a selected one of the memory cells of the cell unit 210, e.g., the memory cell 310, an input voltage signal at the boost enable node 440 transitions from high to low. The low input voltage signal, which corresponds to the ground voltage, is applied to the input terminal of the delay circuit 420, which delays, i.e., inverts twice a level of, the low input voltage signal to generate a low output voltage at the output terminal of the delay circuit 420. This pulls a voltage signal at the gate terminals of the NMOS capacitors of the capacitor unit 430 low.

The low input voltage signal is also applied to the gate terminal of the switch 460, which electrically couples the boost voltage node 410 to the source voltage node 450. This causes a nominal voltage that corresponds to the source voltage (VDD) to appear at the boost voltage node 410. This, in turn, enables the word line driver of the driver circuit 240 connected to the memory cell 310 through the word line (WL) to provide to the word line (WL) a driving voltage that corresponds to the nominal voltage. Concurrently, the bit line selecting unit 220 (see FIG. 2) selects the bit line (BL), whereby a bit '0' or '1' is written/stored in the memory cell 310.

Subsequently, write operations, which are similar to the write operation described above, are performed on the other memory cells of the cell unit 210, whereby data are written in the memory device 200.

Although the embodiment set forth above exemplified the activation of the boost voltage generator 250 as being performed only during read operations of the memory device 200, it is contemplated that the boost voltage generator 250 may be activated during write operations of the memory device 200.

Figure 5:
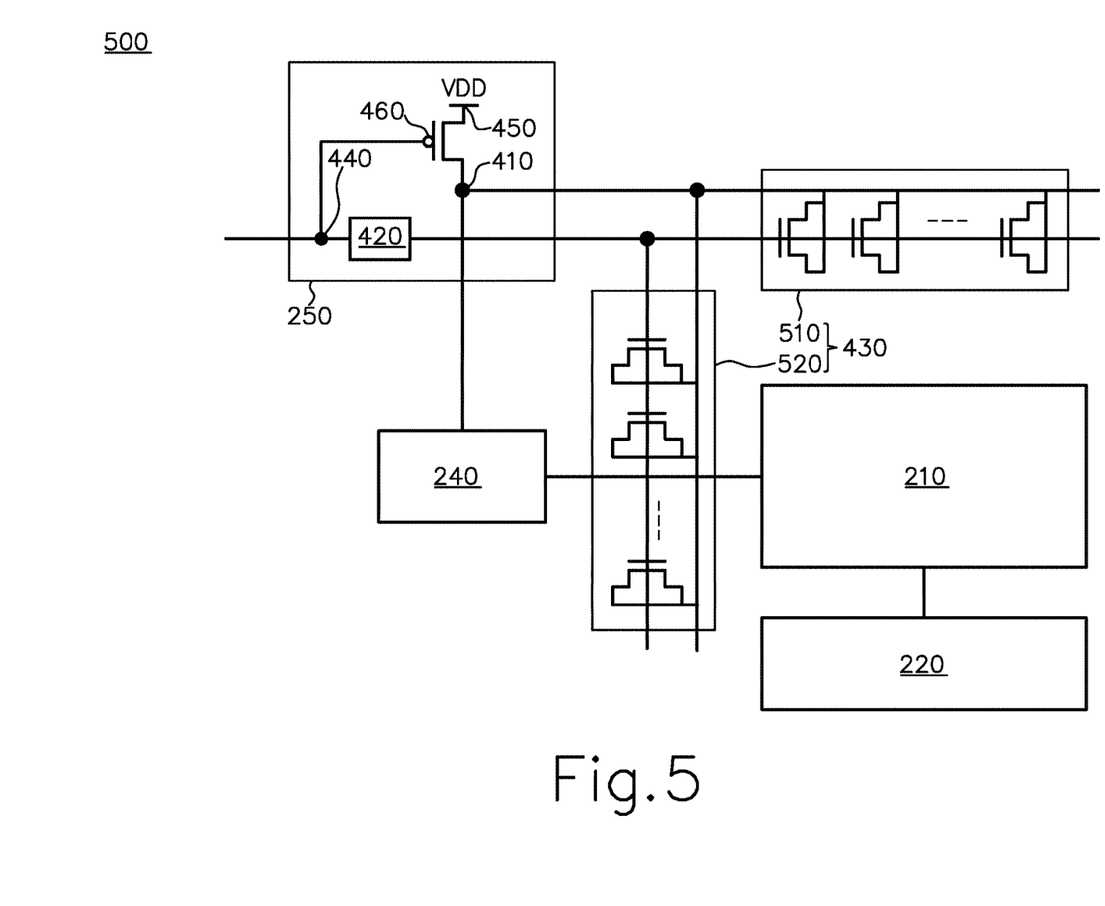
FIG. 5 is a schematic diagram of another exemplary memory device according to some embodiments.

Another exemplary memory device 500, according to some embodiments, is illustrated in FIG. 5. This embodiment differs from the previous embodiment in that the capacitor unit 430 includes a pair of sets of NMOS capacitors 510, 520, each of which has first and second source/drain terminals connected to each other and to the boost voltage node 410 and a gate terminal connected to the output terminal of the delay circuit 420. In some embodiments, the capacitor unit 430 includes PMOS capacitors. In other embodiments, the capacitor unit 430 may include any type of capacitor, including, for example, a MIM capacitor.

As illustrated in FIG. 5, the NMOS capacitors 510 are arranged along a row direction and the number thereof is equal to the number of the memory cells of the cell unit 210 in a row. Similarly, the NMOS capacitors 520 are arranged along a column direction and the number thereof is equal to the number of the memory cells of the cell unit 210 in a column. It will be appreciated that the NMOS capacitors 510, 520 of the capacitor unit 430 may be arranged in other orientations as needed and the numbers thereof may be varied as required.

The read and write operations of the memory device 500 will now be described, by way of example, with reference to FIG. 5.

When performing a read operation on a selected one of the memory cells of the cell unit 210, an input voltage signal at the boost enable node 440 transitions from low to high. The high input voltage signal, which corresponds to the source voltage (VDD), is applied to the gate terminal of the switch 460. This electrically decouples the boost voltage node 410 from the source voltage node 450.

The high input voltage signal is also applied to the input terminal of the delay circuit 420, which delays, i.e., inverts twice a level of, the high input voltage signal to generate a high output voltage at the output terminal thereof. This enables the capacitor unit 430 to apply a boosted voltage greater than the high output voltage to the boost voltage node 410, i.e., across the word line driver of the driver circuit 240 connected to the selected one of the memory cells of the cell unit 210. This, in turn, enables the word line driver of the driver circuit 240 to provide to a word line connected to the selected one of the memory cells of the cell unit 210 a driving voltage that corresponds to the boosted voltage. Concurrently, the bit line selecting unit 220 selects a bit line connected to the selected one of the memory cells of the cell unit 210, whereby bit '0' or '1' is read/retrieved from the selected one of the memory cells of the cell unit 210.

Subsequently, read operations, which are similar to the read operation described above, are performed on the other memory cells of the cell unit 210, whereby data are read from the memory device 500.

It should be understood that the delay circuit 420 may be configured to ensure that the boost voltage node 410 is electrically decoupled from the source voltage node 450 by the time the high output voltage reaches the gate terminals of the NMOS capacitors 510, 520 during read operations of the memory device 500.

Thereafter, when performing a write operation on a selected one of the memory cells of the cell unit 210, an input voltage signal at the boost enable node 440 transitions from high to low. The low input voltage signal, which corresponds to the ground voltage, is applied to the input terminal of the delay circuit 420, which delays, i.e., inverts twice a level of, the low input voltage signal to generate a low output voltage at the output terminal thereof. This pulls a voltage signal at the gate terminals of the NMOS capacitors 510, 520 low.

The low input voltage signal is also applied to the gate terminal of the switch 460, which electrically couples the boost voltage node 410 to the source voltage node 450. This causes a nominal voltage that corresponds to the source voltage (VDD) to appear at the boost voltage node 410. This, in turn, enables the word line driver of the driver circuit 240 connected to the selected one of the memory cells of the cell unit 210 to provide to a word line connected to the selected one of the memory cells of the cell unit 210 a driving voltage that corresponds to the nominal voltage. Concurrently, the bit line selecting unit 220 selects a bit line connected to the selected one of the memory cells of the cell unit 210, whereby a bit '0' or '1' is written/stored in the selected one of the memory cells of the cell unit 210.

Subsequently, write operations, which are similar to the write operation described above, are performed on the other memory cells of the cell unit 210, whereby data are written in the memory device 500.

Although the embodiment set forth above exemplified the activation of the boost voltage generator 250 as being performed only during read operations of the memory device 500, it is contemplated that the boost voltage generator 250 may be activated during write operations of the memory device 500.

Figure 6:
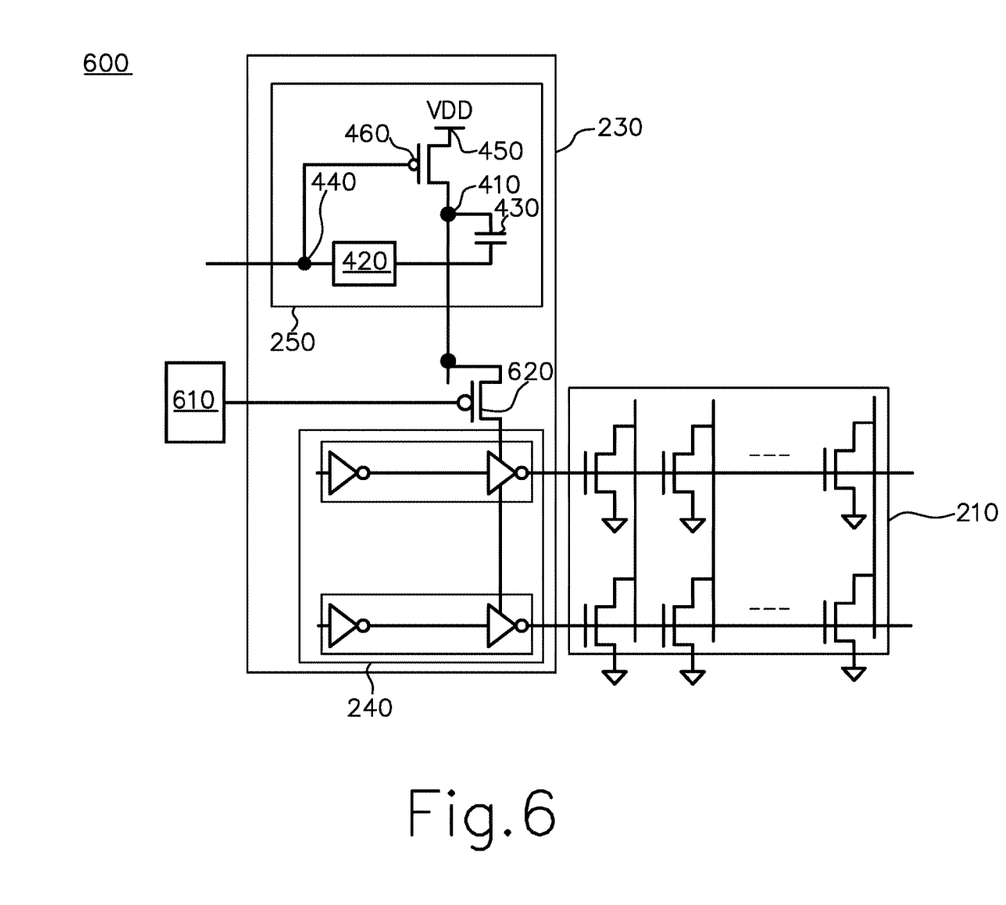
FIG. 6 is a schematic diagram of another exemplary memory device according to some embodiments.

Another exemplary memory device 600, according to some embodiments, is illustrated in FIG. 6. This embodiment differs from previous embodiments in that the memory device 600 further includes a plurality of the cell units 210, a plurality of the word line driving units 230, and a switch controller 610. For clarity, only one of the cell units 120 and one of the word line driving units 230 are shown FIG. 6. The word line driving unit 230 further includes a plurality of switches 620. For clarity, only one of the switches 620 is shown in FIG. 6. The switch 620 in this embodiment is a PMOSFET and has a first source/drain terminal connected to the boost voltage node 410 and a second source/drain terminal connected to the word line drivers of the driver circuit 240. The switch 620 further includes a gate terminal. The switch controller 610 is connected to the gate terminal of the switch 620 and is configured to turn the switch 620 on/off. In some embodiments, the switch 620 is an NMOSFET. In other embodiments, the switch 620 may be any type of transistor, including, for example, a BJT.

The read and write operations of the memory device 600 will now be described, by way of example, with reference to FIG. 6. It is noted that during a read/write operation of the memory device 600, only one of the switches 620 is turned on by the switch controller 610.

When performing a read operation on a selected one of the memory cells of the cell unit 210, an input voltage signal at the boost enable node 440 transitions from low to high and the switch controller 610 turns the switch 620 on. The high input voltage signal, which corresponds to the source voltage (VDD), is applied to the gate terminal of the switch 460. This electrically decouples the boost voltage node 410 from the source voltage node 450.

The high input voltage signal is also applied to the input terminal of the delay circuit 420, which delays, i.e., inverts twice a level of, the high input voltage signal to generate a high output voltage at the output terminal thereof. This enables the capacitor unit 430 to apply a boosted voltage greater than the high output voltage to the boost voltage node 410, i.e., across the word line driver of the driver circuit 240 connected to the selected one of the memory cells of the cell unit 210. This, in turn, enables the word line driver of the driver circuit 240 to provide to a word line connected to the selected one of the memory cells of the cell unit 210 a driving voltage that corresponds to the boosted voltage. Concurrently, the bit line selecting unit 220 (see FIG. 2) selects a bit line connected to the selected one of the memory cells of the cell unit 210, whereby the bit '0' or '1' is read/retrieved from the selected one of the memory cells of the cell unit 210.

Subsequently, read operations, which are similar to the read operation described above, are performed on the other memory cells of the cell unit 210, whereby the data are read from the memory device 600.

It should be understood that the delay circuit 420 may be configured to ensure that the boost voltage node 410 is electrically decoupled from the source voltage node 450 by the time the high output voltage reaches the gate terminals of the NMOS capacitors of the capacitor unit 430 during read operations of the memory device 600.

Thereafter, when performing a write operation on a selected one of the memory cells of the cell unit 210, an input voltage signal at the boost enable node 440 transitions from high to low and the switch controller 610 turns the switch 620 on. The low input voltage signal, which corresponds to the ground voltage, is applied to the input terminal of the delay circuit 420, which delays, i.e., inverts twice a level of, the low input voltage signal to generate a low output voltage at the output terminal thereof. This pulls a voltage signal at the gate terminals of the NMOS capacitors of the capacitor unit 430 low.

The low input voltage signal is also applied to the gate terminal of the switch 460, which electrically couples the boost voltage node 410 to the source voltage node 450. This causes a nominal voltage that corresponds to the source voltage (VDD) to appear at the boost voltage node 410. This, in turn, enables the word line driver of the driver circuit 240 connected to the selected one of the memory cells of the cell unit 210 to provide to a word line connected to the selected one of the memory cells of the cell unit 210 a driving voltage that corresponds to the nominal voltage. Concurrently, the bit line selecting unit 220 (see FIG. 2) selects a bit line connected to the selected one of the memory cells of the cell unit 210, whereby a bit '0' or '1' is written/stored in the selected one of the memory cells of the cell unit 210.

Subsequently, write operations, which are similar to the write operation described above, are performed on the other memory cells of the cell unit 210, whereby data are written in the memory device 600.

Although the embodiment set forth above exemplified the activation of the boost voltage generator 250 as being performed only during read operations of the memory device 600, it is contemplated that the boost voltage generator 250 may be activated during write operations of the memory device 600.

It has thus been shown that the memory device of the present disclosure comprises a word line driving unit that includes a driver circuit and a boost voltage generator. The driver circuit includes a word line driver. The boost voltage generator generates a boosted voltage greater than an operating voltage, e.g., 0.44 V, of the memory device and applied across the word line driver. The construction as such permits the word line driver to provide a driving voltage that has a short pulse duration, e.g., 12.63 ns.

In an exemplary embodiment, a word line driving unit comprises a word line driver and a boost voltage generator. The boost voltage generator includes a boost voltage node that is coupled to the word line driver, a delay circuit that has input and output terminals, and a capacitor unit that is between the boost voltage node and the output terminal of the delay circuit.

In another embodiment, a memory device comprises a memory cell, a word line, a word line driver, and a boost voltage generator. The word line is coupled to the memory cell. The word line driver is coupled to the word line. The boost voltage generator includes a boost voltage node that is coupled to the word line driver, a delay circuit that has input and output terminals, and a capacitor unit that is between the boost voltage node and the output terminal of the delay circuit.

In another exemplary embodiment, a method comprises delaying an input voltage signal to generate an output voltage, enabling a capacitor unit to apply across a word line driver a boosted voltage greater than the output voltage, and enabling the word line driver to provide a driving voltage that corresponds to the boosted voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A word line driving unit of a memory device, comprising:
 a word line driver; and
 a boost voltage generator including
  a boost voltage node that is coupled to the word line driver,
  a delay circuit that has an output terminal, and
  a capacitor unit that is between the boost voltage node and the output terminal of the delay circuit, the capacitor unit including a plurality of capacitors that are arranged along one direction, wherein the number of capacitors in the plurality of capacitors corresponds to the number of memory cells arranged in the one direction of the memory device.

2. The word line driving unit of claim 1, wherein the delay circuit further includes an input terminal, the word line driving unit further comprising a switch coupled to the boost voltage node and the input terminal of the delay circuit.

3. The word line driving unit of claim 1, wherein the one direction is a column direction.

4. The word line driving unit of claim 1, wherein the one direction is a row direction.

5. The word line driving unit of claim 1, wherein the capacitor unit includes a metal-oxide-semiconductor (MOS) capacitor.

6. The word line driving unit of claim 1, wherein the capacitor unit includes a metal-insulator-metal (MIM) capacitor.

7. The word line driving unit of claim 1, further comprising a switch between the boost voltage node and the word line driver.

8. The word line driving unit of claim 7, further comprising a switch controller coupled to the switch and configured to control operation of the switch.

9. The word line driving unit of claim 7, further comprising:
a plurality of the word line drivers that are divided into a plurality of groups; and
a plurality of the switches, each of which is between the boost voltage node and the word line drivers in a respective one of the groups.

10. The word line driving unit of claim 1, further comprising a plurality of the word line drivers, wherein the boost voltage generator is shared by the word line drivers.

11. The word line driving unit of claim 1, wherein the delay circuit includes an inverter.

12. A memory device comprising:
a plurality of memory cells arranged along one direction;
a word line driver coupled to the plurality of memory cells; and
a boost voltage generator including
a boost voltage node that is coupled to the word line driver,
a delay circuit that has an output terminal, and
a capacitor unit that is between the boost voltage node and the output terminal of the delay circuit, the capacitor unit including a plurality of capacitors that are arranged along the one direction, wherein the number of capacitors in the plurality of capacitors corresponds to a number of memory cells arranged in the one direction of the memory device.

13. The memory device of claim 12, wherein the delay circuit further includes an input terminal, the word line driving unit further comprising a switch coupled to the boost voltage node and the input terminal of the delay circuit.

14. The memory device of claim 12, wherein the one direction is a column direction.

15. The memory device of claim 12, wherein the one direction is a row direction.

16. The memory device of claim 12, further comprising a switch between the boost voltage node and the word line driver.

17. The memory device of claim 16, further comprising:
a plurality of the word line drivers that are divided into a plurality of groups; and
a plurality of the switches, each of which is between the boost voltage node and the word line drivers in a respective one of the groups.

18. The memory device of claim 12, wherein the delay circuit includes an inverter.

19. A word line driving unit of a memory device, comprising:
a plurality of word line drivers, each of the plurality of word line drivers being coupled to one of a plurality of word lines of the memory device; and
a boost voltage generator including
a boost voltage node that is coupled to the plurality of word line drivers,
a delay circuit includes a pair of inverters coupled in series, and
a capacitor unit coupled between an output terminal of the delay circuit and the boost voltage node, the capacitor unit including a plurality of MOSFET capacitors, each of the plurality of MOSFET capacitors having a gate terminal coupled to the output terminal of the delay circuit and first and second source/drain terminals coupled to the boost voltage node,
the plurality of MOSFET capacitors being arranged along one of a row direction or a column direction, wherein the number of capacitors in the plurality of MOSFET capacitors corresponds to the number of memory cells arranged in the row direction or column direction of the memory device.

20. The word line driving unit of claim 19, wherein the capacitor unit further includes a second plurality of MOSFET capacitors, each of the second plurality of MOSFET capacitors having a gate terminal coupled to the output terminal of the delay circuit and first and second source/drain terminals coupled to the boost voltage node,
the second plurality of MOSFET capacitors being arranged along a different one of the row direction or column direction, wherein the number of capacitors in the second plurality of MOSFET capacitors corresponds to the number of memory cells arranged in the row direction or column direction of the memory device.

* * * * *